(12) United States Patent
Kane et al.

(10) Patent No.: US 11,277,928 B2
(45) Date of Patent: Mar. 15, 2022

(54) INTERLOCKING DEVICE FOR SHIPMENT MONITORING AND ACCLIMATION

(71) Applicant: INTERNATIONAL BUSINESS MACHINES CORPORATION, Armonk, NY (US)

(72) Inventors: Michael Kane, Hopewell Junction, NY (US); Colin Edward Masterson, Rochester, MN (US); Suraush Khambati, Poughkeepsie, NY (US); Jacob Porter, Highland, NY (US); Marie Cole, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 192 days.

(21) Appl. No.: 16/800,345

(22) Filed: Feb. 25, 2020

(65) Prior Publication Data

US 2021/0267071 A1    Aug. 26, 2021

(51) Int. Cl.
*H05K 5/02* (2006.01)
*G06Q 10/08* (2012.01)

(52) U.S. Cl.
CPC ....... *H05K 5/0208* (2013.01); *G06Q 10/0832* (2013.01); *H05K 5/0204* (2013.01); *H05K 5/0221* (2013.01); *H05K 5/0247* (2013.01)

(58) Field of Classification Search
CPC .................................................... H05K 5/0208
See application file for complete search history.

(56) References Cited

U.S. PATENT DOCUMENTS

| 7,250,858 | B2 | 7/2007 | Schmidtberg |
| 8,890,683 | B2 | 11/2014 | Schnitz |
| 9,142,107 | B2 | 9/2015 | Stevens |
| 9,742,182 | B1 | 8/2017 | David |
| 10,048,733 | B2 | 8/2018 | David |

(Continued)

FOREIGN PATENT DOCUMENTS

EP    31188241 B1    11/2018

OTHER PUBLICATIONS

Viman et al., "XpertTrack: Precision Autonomous Measuring Device Developed for Real Time Shipments Tracker", Sensors 2016, https://pdfs.semanticscholar.org/c785/43cd42cefcf2b3295575acbdece851fb7483.pdf, pp. 1-16.

*Primary Examiner* — Hung V Ngo
(74) *Attorney, Agent, or Firm* — Tihon Poltavets

(57) ABSTRACT

An interlocking device for monitoring and enforcing shipping and acclimation conditions includes a servo motor, at least one locking pin, a battery, and a printed circuit board disposed within an enclosure, where the battery is electrically coupled to the servo motor and the printed circuit board. The interlocking device further includes a housing of an input power connector insertable into a first end of the enclosure to prevent the housing of the input power connector from electrically coupling to a power source, where the servo motor is configurable to engage the at least one locking pin to prevent a removal of the housing of the input power connector while inserted in the first end of the enclosure. The interlocking device further includes the printed circuit board configured to control the servo motor based on readings from one or more sensors electrically coupled to the printed circuit board.

16 Claims, 10 Drawing Sheets

(56) References Cited

U.S. PATENT DOCUMENTS

| | | |
|---|---|---|
| 10,524,368 B1 * | 12/2019 | Betancourt .............. G07C 9/28 |
| 10,751,250 B1 * | 8/2020 | Khalil ..................... H02J 7/025 |
| 2003/0156392 A1 * | 8/2003 | Henson ................ H05K 5/0208 |
| | | 361/752 |
| 2011/0170249 A1 | 7/2011 | Nunes |
| 2012/0252488 A1 | 10/2012 | Hartmann et al. |
| 2015/0016001 A1 | 1/2015 | Quirk |
| 2015/0114051 A1 * | 4/2015 | Mao .................... H05K 5/0208 |
| | | 70/57 |
| 2015/0213709 A1 | 7/2015 | Miller |
| 2018/0079588 A1 * | 3/2018 | Whittington ........... B65D 85/38 |
| 2019/0066042 A1 | 2/2019 | Conlon |
| 2021/0100113 A1 * | 4/2021 | Lamprecht ........... H05K 5/0221 |

* cited by examiner

INTERLOCKING DEVICE FOR SHIPMENT MONITORING AND ACCLIMATION

BACKGROUND OF THE INVENTION

This disclosure relates generally to shipment monitoring and acclimation enforcement, and in particular, to an interlocking device for shipment monitoring and acclimation enforcement.

Mainframes and other rack configured electronic equipment typically have strict environmental and handling parameters which need to be adhered to during a shipping process to prevent any impact or shock damage to the sensitive electronic equipment within. Furthermore, subsequent to the electronic equipment arriving at a destination (e.g., datacenter), the electronic equipment requires acclimation to local environmental conditions at the destination prior to installation. Enforcement of the environmental and handling parameters, along with proper acclimation procedures is challenging due to the absence of a dedicated observer throughout the entire shipping and acclimation process.

SUMMARY

One aspect of an embodiment of the present invention discloses an interlocking device for monitoring and enforcing shipping and acclimation conditions, the interlocking device comprising a servo motor, at least one locking pin, a battery, and a printed circuit board disposed within an enclosure, wherein the battery is electrically coupled to the servo motor and the printed circuit board. The interlocking device further comprising a housing of an input power connector insertable into a first end of the enclosure to prevent the housing of the input power connector from electrically coupling to a power source, wherein the servo motor is configurable to engage the at least one locking pin to prevent a removal of the enclosure from the housing of the input power connector. The interlocking device further comprising the printed circuit board configured to control the servo motor based on readings from one or more sensors electrically coupled to the printed circuit board.

Another aspect of an embodiment of the present invention discloses a method for monitoring and enforcing shipping acclimation condition utilizing an interlocking device, the method comprising, responsive to enabling an interlocking device for a shipment process and acclimation process of electronic equipment, monitoring, by the interlocking device, conditions during the shipment process based on one or more readings from one or more sensors associated with the interlocking device. The method further comprising, responsive to determining if a mishandling event has occurred during the shipping process based on the one or more readings, logging a first reading out of the one or more readings responsible for the mishandling event. The method further comprising, responsive to determining if the electronic equipment has arrived at a delivery location, measuring, by the interlocking device, one or more delivery location conditions during the acclimation process of the electronic equipment. The method further comprising, responsive to determining if one or more acclimation requirements for the electronic are met based on the one or more delivery location conditions, disabling the interlock device.

BRIEF DESCRIPTION OF THE SEVERAL VIEWS OF THE DRAWINGS

The following detailed description, given by way of example and not intended to limit the disclosure solely thereto, will best be appreciated in conjunction with the accompanying drawings, in which.

DETAILED DESCRIPTION

Figure 1A:
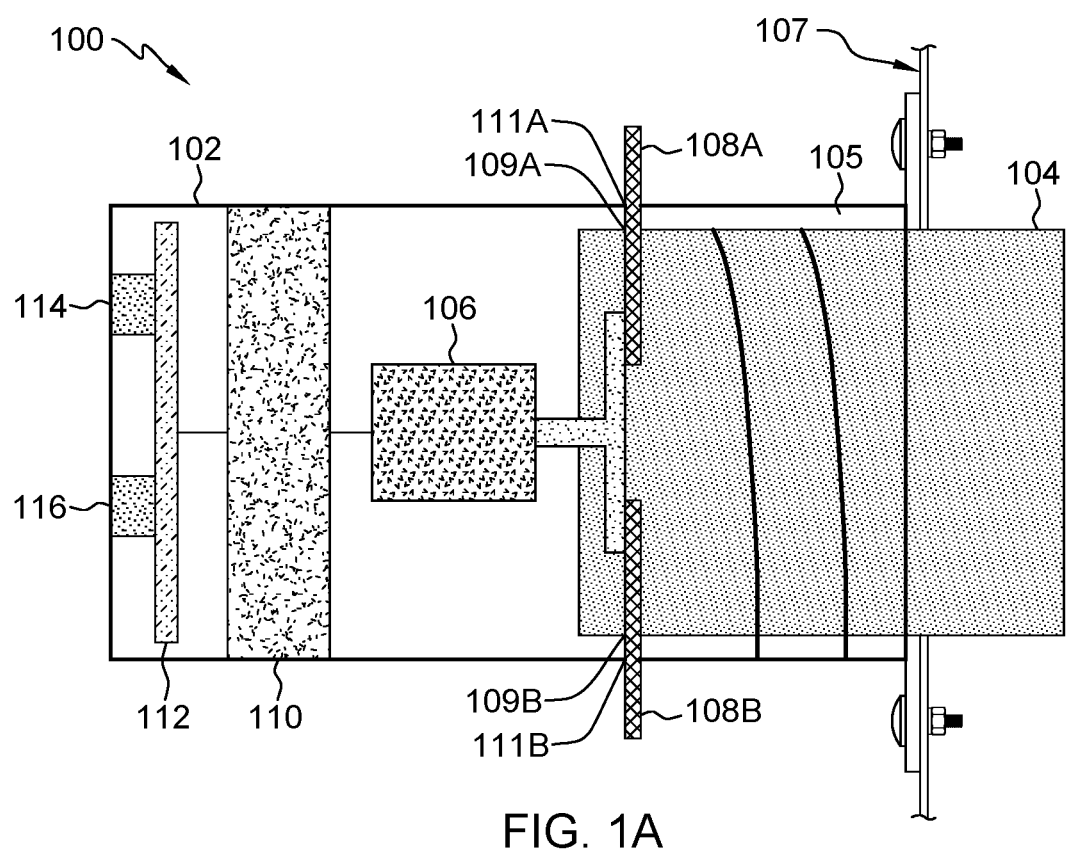
FIG. 1A depicts an interlocking device installed on a PDU connector, in accordance with an embodiment of the present invention.

Embodiments of the present invention provide an interlocking device for monitoring and enforcing shipment and acclimation conditions, where the interlocking device is attachable to a housing of an input power connector. The interlocking device can be configured to slide over the housing of the input power connector or slide into the housing of the input power connector, preventing the input power connector from electrically coupling to a power source. The interlocking device includes an enclosure housing a printed circuit board electrically coupled to battery power source, where the battery power source provides power to the printed circuit board and a locking servo. The locking servo of the interlocking device is configured to engage one or more locking pins, where the engaged one or more locking pins prevent the removal of the interlocking device from the housing of the input power connector. The printed circuit board includes a data port and an ethernet port for transferring data collected by the interlocking device, where the data collected by the interlocking device indicates shipping and acclimation conditions. Responsive to shipping and acclimation conditions being met, interlocking device disengages the one or more locking pins to allow for the removal of the interlocking device from the housing of the input power connector.

Detailed embodiments of the present invention are disclosed herein with reference to the accompanying drawings;

however, it is to be understood that the disclosed embodiments are merely illustrative of potential embodiments of the invention and may take various forms. In addition, each of the examples given in connection with the various embodiments is also intended to be illustrative, and not restrictive. This description is intended to be interpreted merely as a representative basis for teaching one skilled in the art to variously employ the various aspects of the present disclosure. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements. The term substantially, or substantially similar, refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Many common fabrication techniques involve securing two objects using an adhesive layer between the objects. Oftentimes, the adhesive layer is chosen in an attempt to permanently secure the two objects together. And while this adhesive layer selection may be advantageous for typical usage of the overall product, there may be instances where separation of the joined objects is either desired, or necessary. In such instances, separation of the two objects, without physically damaging either of the objects, may be required so that one or both of the objects may be reused.

FIG. 1A depicts an interlocking device installed on a PDU connector, in accordance with an embodiment of the present invention. Interlocking device 100 includes enclosure 102, where housing 104 of an input power connector is insertable and slidable inside cavity 105 of enclosure 102. Housing 104 represents a portion of the input power connector that allows the input power connector to electrically couple electronic equipment 107 (e.g., power distribution unit, bulk power assembly) to a power source. In other embodiments, the input power connector is a power cable for electrically coupling to a power source, where housing 104 is a connector portion of the power cable. In an engaged state, interlocking device 100 is mechanically coupled to housing 104 of the input power connector, preventing housing 104 from electrically coupling to the power source. In a disengaged state, interlocking device 100 is decoupled from housing 104 of the input power connector, allowing for interlocking device 100 to be removed from housing 104 exposing one or more electrical prongs for electrically coupling housing 104 to the power source. In this embodiment, housing 104 is disposed inside cavity 105 of enclosure 102, where interlocking device 100 is in the engaged state. In other embodiments, housing 104 is partially disposed inside cavity 105 of enclosure.

Enclosure 102 houses servo motor 106 configured to mechanically operate locking pins 108A and 108B, where locking pins 108A and 108B represent members that dictate whether interlocking device 100 is the engaged state or the disengaged state. In the engaged state, each of locking pins 108A and 108B extend through the associated connector aperture 109A and 109B of housing 104 preventing the removal of interlocking device 100 from housing 104. Locking pins 108A and 108B extending through the associated connector aperture 109A and 109B prevent interlocking device 100 from sliding off housing 104 of the input power connector. In the disengaged state, each locking pin 108A and 108B retract through the associated connector aperture 109A and 109B of housing 104, allowing for the removal of interlocking device 100 from housing 104. With locking pins 108A and 108B retracted through the associated connector aperture 109A and 109B of housing 104, interlocking device 100 is slidable along housing 104 and removeable. In this embodiment, each of locking pins 108A and 108B extend through associated connector aperture 109A and 109B in housing 104 and through associated enclosure aperture 111A and 111B of enclosure 102. Portions of locking pins 108A and 108B extending beyond an exterior planar surface of interlocking device 100 serve as a visual indicator of the engaged state. In other embodiments, locking pins 108A and 108B extend only through associated connector apertures 109A and 109B in housing 104.

Interlocking device 100 further includes battery 110 and printed circuit board (PCB) 112 disposed in enclosure 102, where battery 110 is electrically coupled to servo motor 106 and PCB 112. Battery 110 represent a rechargeable power source for providing power to servo motor 106 and PCB 112. In this embodiment, PCB 112 includes USB-C port 114 and ethernet port 116 to allow for the transfer of data (i.e., data transfer port) between interlocking device 100 and an external computing device, such as server computer 202 and client device 204, discussed in further detail with regards to FIG. 2. USB-C port 114 also allows for the charging of battery 110 when interlocking device 100 is being serviced and represents a charging downstream port (CDP). USB-C port 114 and ethernet port 116 are positioned in such a manner on enclosure 102 to allow for a USB-C cable and ethernet cable to be inserted in the corresponding USB-C port 114 and ethernet port 116 of interlocking device 100. In another embodiment, interlocking device 100 includes USB-C port 114 and an embedded communication module (e.g., Wi-Fi, Bluetooth) on PCB 112 for transferring data collected by interlocking device 100. In yet another embodiment, interlocking device 100 includes one or more light-emitting diodes (LED) indicators viewable by a technician, where the one or more light-emitting diodes provide operational information for interlocking device 100. The operational information for interlocking device 100 can include an engaged status for locking pins 108A and 108B, a disengaged status for locking pins 108A and 108B, a charge level for battery 110, a data transfer indicator via USB-C port 114, a data transfer indicator via ethernet port 116, a data transfer indicator via.an embedded communication module on PCB 112, and an operational fault of interlocking device 100.

Figure 1B:
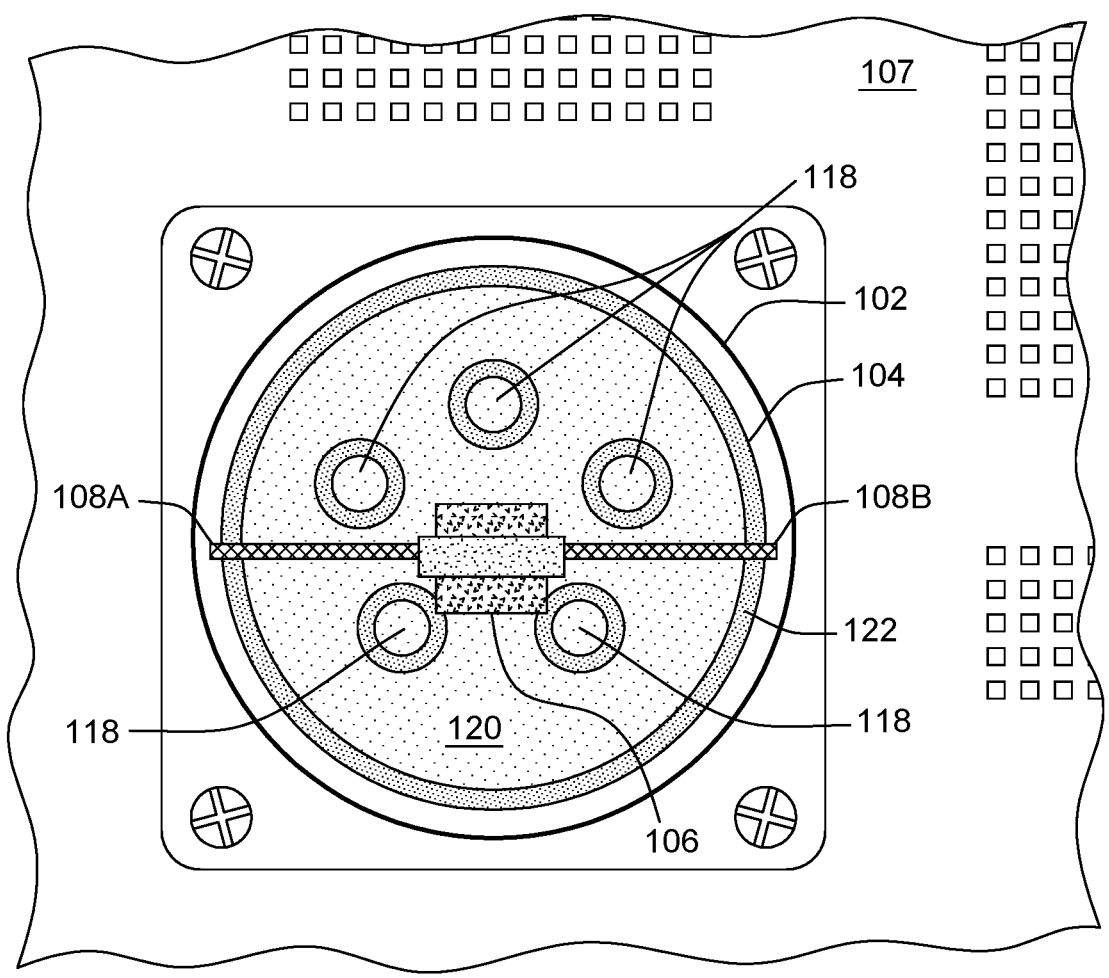
FIG. 1B depicts a cross-sectional view of an example configuration of the locking pins of the interlocking device installed on the PDU connector, in accordance with an embodiment of the present invention.

FIG. 1B depicts a cross-sectional view of an example configuration of the locking pins of the interlocking device installed on the PDU connector, in accordance with an embodiment of the present invention. A cross-sectional shape of enclosure 102 is such to accommodate a cross-sectional shape of housing 104, when housing 104 is at least partially inserted into interlocking device 100. In this embodiment, housing 104 of the input power connector is a power distribution unit (PDU) connector protruding from electronic equipment 107 with a circular cross section, where a circular cross section of enclosure 102 accommodates housing 104. An area for the circular cross section of the enclosure 102 is greater than the circular cross section of housing 104 to allow for the installation and removal of interlocking device 100 without introducing wear on the outer surface of housing 104. Housing 104 includes five prongs 118 protruding from a recessed base 120, where outer shell 122 of housing 104 extends beyond a top planar surface of prongs 118. In some embodiments, locking pins 108A and 108B can extend through an aperture in one or more of the prongs 118 when interlocking device 100 is in an engaged state. In this embodiment, servo motor 106 creates a rotational movement, where a clockwise rotational movement moves locking pins 108A and 108B into the apertures of housing 104 (i.e., engaged state) and a counterclockwise rotational movement moves locking pins 108A and 108B out of the apertures of housing 104 (i.e., disengaged state). Alternatively, a counterclockwise rotational movement moves locking pins 108A and 108B into the apertures of housing 104 (i.e., engaged state) and a clockwise rotational movement moves locking pins 108A and 108B out of the apertures of housing 104 (i.e., disengaged state). In another embodiment, servo motor 106 is mechanically coupled to one or more rack and pinion (i.e., circular gear and linear gear) combinations to actuate the engaging and disengaging motions of locking pins 108A and 108B.

In this embodiment, servo motor 106 actuates locking pins 108A and 108B in the longitudinal direction, where locking pins 108A and 108B extend through apertures in housing 104 preventing the removal of interlocking device 100 from housing 104 in an engaged state. As previously discussed, locking pins 108A and 108B can also extend through apertures in enclosure 102, where portions of locking pins 108A and 108B extending beyond the exterior planar surface of interlocking device 100 serve as a visual indicator of the engaged state. In another embodiment, servo motor actuates locking pins 108A and 108B in the longitudinal direction, where locking pins 108A and 108B are pressed against an inner surface of outer shell 122 of housing 104 and servo motor 106 locks into a set position. The pressure created by locking pins 108A and 108B against the inner surface of outer shell 122 of housing 104 prevents the removal on interlocking device 100. Furthermore, the ends of each of locking pin 108A and 108B can include an abrasive surface to increase the coefficient of friction between the ends of locking pins 108A and 108B and the inner surface of outer shell 122. The abrasive surface on the ends of locking pins 108A and 108B can also act as a tampering indicator, where the abrasive end of locking pins 108A and 108B score and mark the inner surface of outer shell 122 of housing 104 if interlocking device 100 is forcibly removed while in an engaged state. The abrasive surface represents an abrasive grain bonded to a flexible substrate utilizing an adhesive to couple the abrasive grain and flexible substrate to the ends of each of locking pins 108A and 108B. The abrasive grain can include a hard mineral rated at 7 or above on the Mohs scale of mineral hardness.

Figure 1C:
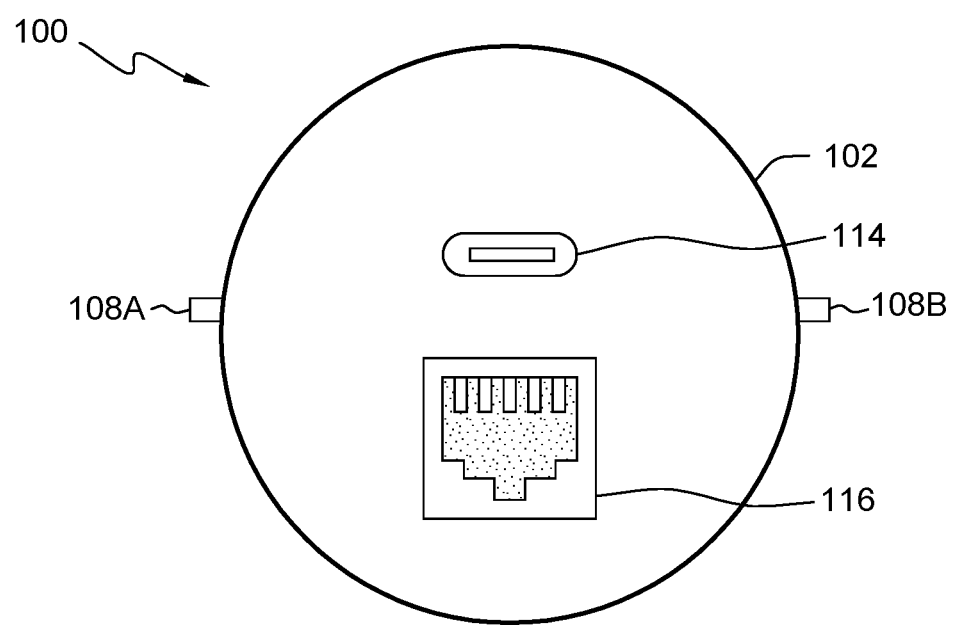
FIG. 1C depicts a frontal view of the interlocking device installed on the PDU connector, in accordance with an embodiment of the present invention.

FIG. 1C depicts a frontal view of the interlocking device installed on the PDU connector, in accordance with an embodiment of the present invention. The frontal view of interlocking device 100 illustrates USB-C port 114 and ethernet port 116 accessible by a technician for transferring data gathered by interlocking device during the shipping and acclimation process. The portions of locking pins 108A and 108B protruding from an exterior planar surface of enclosure 102 indicating that interlocking device 100 is in an engaged state and therefore not removable from housing 104. In a disengaged state, the portions of locking pins 108A and 108B would not protrude from the exterior planar surface of enclosure 102 of interlocking device 100.

Figure 1D:
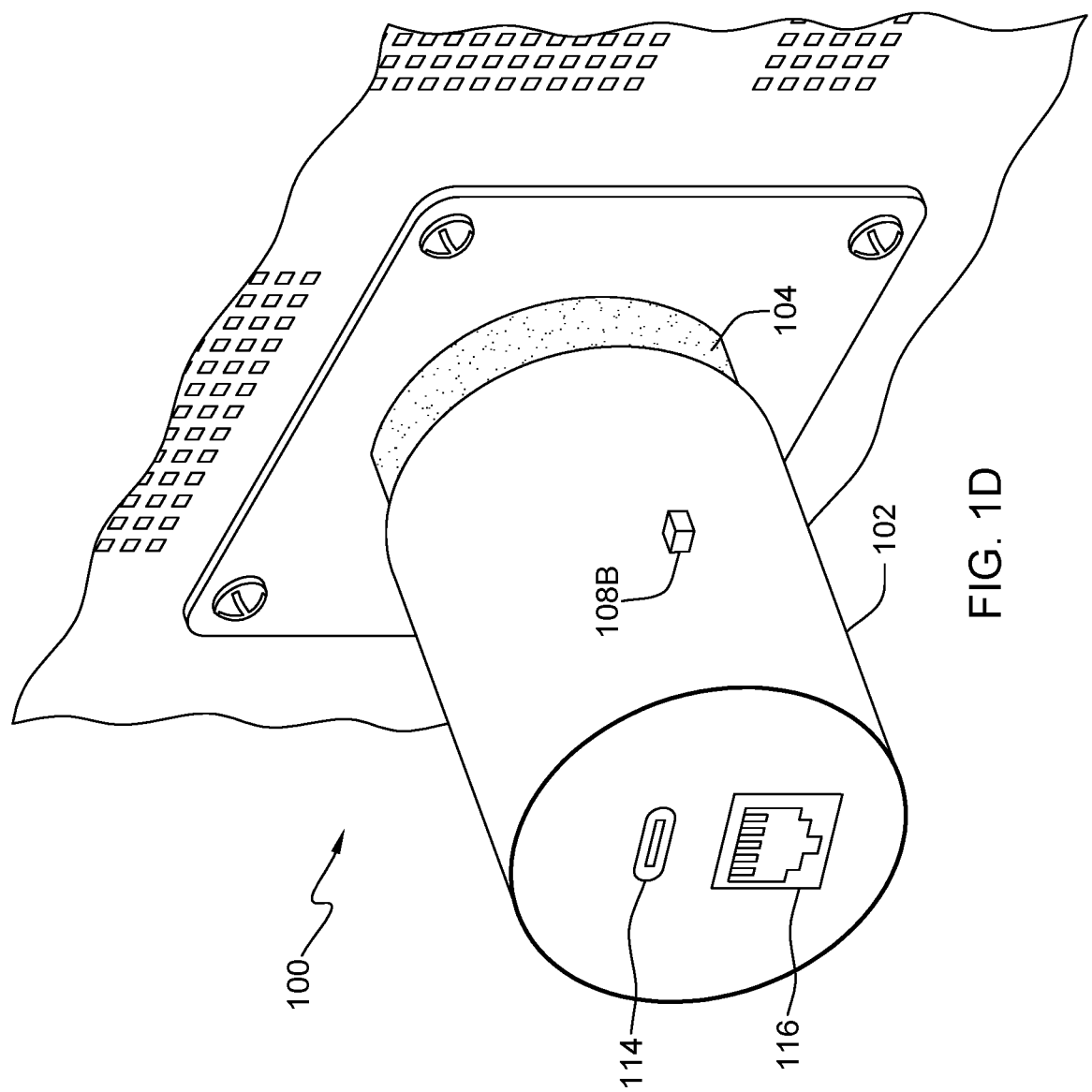
FIG. 1D depicts a three-dimensional view of the interlocking device installed on the PDU connector, in accordance with an embodiment of the present invention.

FIG. 1D depicts a three-dimensional view of the interlocking device installed on the PDU connector, in accordance with an embodiment of the present invention. The three-dimensional view of interlocking device 100 illustrates the cylindrical shape of interlocking device 100 and housing 104, where a cross sectional circular area of enclosure 102 is greater than a cross sectional circular area of housing 104 to allow interlocking device 100 to slide over housing 104.

The terminology used herein is for the purpose of describing particular embodiments only and is not intended to be limiting to the invention. As used herein, the singular forms "a", "an" and "the" are intended to include the plural forms as well, unless the context clearly indicates otherwise.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

Figure 2:
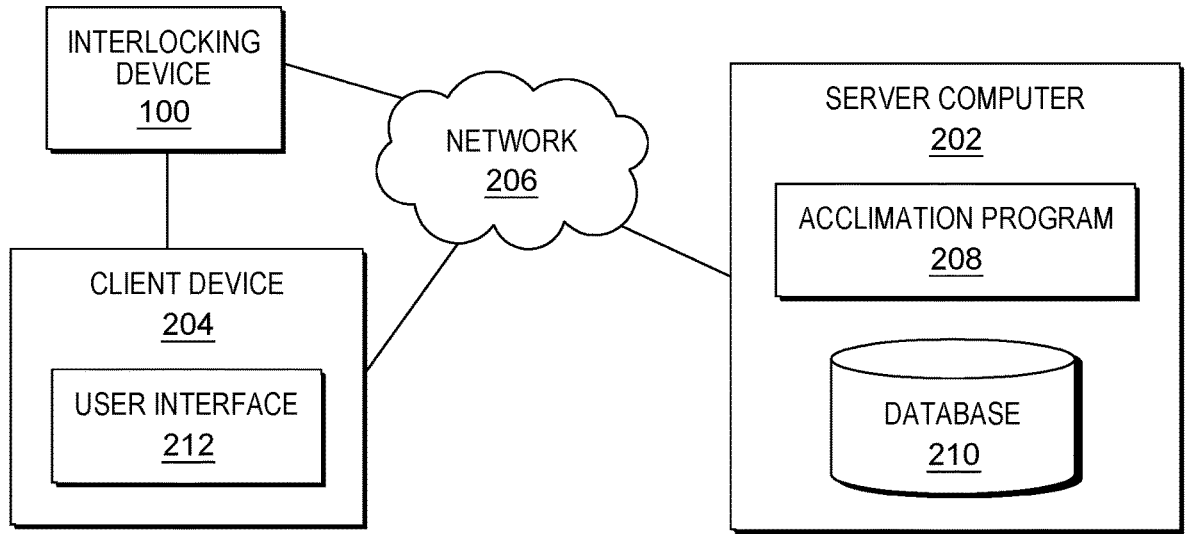
FIG. 2 is a functional block diagram illustrating a distributed data processing environment with the interlocking device, in accordance with an embodiment of the present invention.

FIG. 2 is a functional block diagram illustrating a distributed data processing environment with the interlocking device, in accordance with an embodiment of the present invention. The term "distributed" as used herein describes a computer system that includes multiple, physically distinct devices that operate together as a single computer system. FIG. 2 provides only an illustration of one implementation and does not imply any limitations with regard to the environments in which different embodiments may be implemented. Many modifications to the depicted environment may be made by those skilled in the art without departing from the scope of the invention as recited by the claims. The distributed data processing environment includes interlocking device 100, server computer 202, and client device 204, interconnected over network 206.

Interlocking device 100, previously discussed with regards to FIGS. 1A-1D, monitors shipment and acclimation conditions, where interlocking device 100 is attachable to a housing of an input power connector on associated electronic equipment. Interlocking device 100 has the ability to gather data during a shipping process and an acclimation process, where the data (i.e., readings) includes but is not limited to temperature values, humidity values, pitch angle value, force values, dew point values, and location information. To collect the data during the shipping process and the acclimation process, interlocking device 100 can include a temperature sensor, a humidity sensor, a gyroscope sensor, an accelerometer, a location module (e.g., GPS), and a communication module (e.g., Wi-Fi, Bluetooth). Interlocking device 100 has the ability to collect temperature values, humidity values, pitch angle values, force values and dew point values, and associate the data with location information prior to sending the data with the associated location information to server computer 202. Interlocking device 100 has the ability to connect to network 206 and/or a user of client device 204 has the ability to interface directly for programming, data offload, and manual unlocking (i.e., disengaged state) of interlocking device 100.

Server computer 202 can be a standalone computing device, a management server, a web server, a mobile computing device, or any other electronic device or computing system capable of receiving, sending, and processing data. In other embodiments, server computer 202 can represent a server computing system utilizing multiple computers as a server system, such as in a cloud computing environment. In another embodiment, server computer 108 can be a laptop computer, a tablet computer, a netbook computer, a personal computer (PC), a desktop computer, a personal digital assistant (PDA), a smart phone, or any programmable electronic device capable of communicating with client device 204 and other computing devices (not shown) within the distributed data processing environment via network 206 In another embodiment, server computer 202 represents a computing system utilizing clustered computers and components (e.g., database server computers, application server computers, etc.) that act as a single pool of seamless resources when accessed within the distributed data processing environment. Server computer 202 includes acclimation program 208 and database 210. Server computer 202 may include internal and external hardware components, as depicted and described in further detail with respect to FIG. 6.

Client device 204 can be a laptop computer, a tablet computer, a smart phone, smart watch, a smart speaker, or any programmable electronic device capable of communicating with various components and devices within the distributed data processing environment, via network 206. Client device 204 may be a wearable computer. Wearable computers are miniature electronic devices that may be worn by the bearer under, with, or on top of clothing, as well as in or connected to glasses, hats, or other accessories. Wearable computers are especially useful for applications that require more complex computational support than merely hardware coded logics. In general, client device 204 represents one or more programmable electronic devices or combination of programmable electronic devices capable of executing machine readable program instructions and communicating with other computing devices (not shown) within the distributed data processing environment via a network, such as network 206. In one embodiment, client device 204 represents one or more devices associated with a user and includes an instance of user interface 212 for interacting with acclimation program 208.

Network 206 can be, for example, a telecommunications network, a local area network (LAN), a wide area network (WAN), such as the Internet, or a combination of the three, and can include wired, wireless, or fiber optic connections. Network 206 can include one or more wired and/or wireless networks capable of receiving and transmitting data, voice, and/or video signals, including multimedia signals that include voice, data, and video information. In general, network 206 can be any combination of connections and protocols that will support communications between interlocking device 100, server computer 202, and client device 204, and other computing devices (not shown) within the distributed data processing environment.

Acclimation program 208 has the ability to receive shipping and acclimation data for the electronic equipment associated with interlocking device 100 and determine whether the shipping and acclimation conditions are met prior to installation of the electronic equipment associated with interlocking device 100. As the electronic equipment is prepared for shipment, acclimation program 208 enables the shipping interlocking device (i.e., interlocking device 100), where enabling the shipping interlocking device represents an engaged state where locking pins prevent the removal of the interlocking device from a housing of an input power connector for the electronic equipment. Acclimation program 208 monitors shipping conditions during transit and determines whether a mishandling event has occurred based on the shipping conditions. Response to acclimation program 208 determining a mishandling event has occurred, acclimation program 208 logs and displays a warning with regards to the mishandling event. Subsequent to the electronic equipment arriving at a delivery location (i.e., destination), acclimation program 208 measures delivery location conditions.

Based on the measured delivery location conditions, acclimation program 208 determines whether acclimation requirements for the electronic equipment are met. Responsive to determining the acclimation requirements for the electronic equipment are not met, acclimation program 208 generates a workorder for evaluation and send the workorder to a technician for evaluation. Responsive to determining the acclimation requirements for the electronic equipment are met, acclimation program 208 transmits the shipping and acclimation data collected by the interlocking device and disables the shipping interlocking device. Disabling the shipping interlocking device represents a disengaged state, where locking pins are retracted and allow for the removal of the interlocking device from the housing of the input power connector for the electronic equipment.

Database 210 is a repository for data collected by interlocking device 100 and utilized by acclimation program 208. In the depicted embodiment, database 210 resides on server computer 202. In another embodiment, database 210 may reside on client device 204 or elsewhere within the distributed data processing environment provided acclimation program 208 has access to database 210. Database 210 can be implemented with any type of storage device capable of storing data and configuration files that can be accessed and utilized by acclimation program 208, such as a database server, a hard disk drive, or a flash memory. Database 210 stores data utilized by acclimation program 208, such as temperature values, humidity values, pitch angle value, force values, dew point values, location information, and the like gathered by interlocking device 100.

User interface 212 enables a user to make requests of or issue commands to client device 204 and receive information and instructions in response. In one embodiment, a user of client device 204 accesses user interface 212 via voice commands in natural language. In one embodiment, user interface 212 may be a graphical user interface (GUI) or a web user interface (WUI) and can display text, documents, web browser windows, user options, application interfaces, and instructions for operation, and include the information (such as graphic, text, and sound) that a program presents to a user and the control sequences the user employs to control the program. In another embodiment, user interface 212 may also be mobile application software. In an example, mobile application software, or an "app," is a computer program designed to run on smart phones, tablet computers and other mobile devices. User interface 212 enables a user of client device 204 to interact with acclimation program 208.

Figure 3:
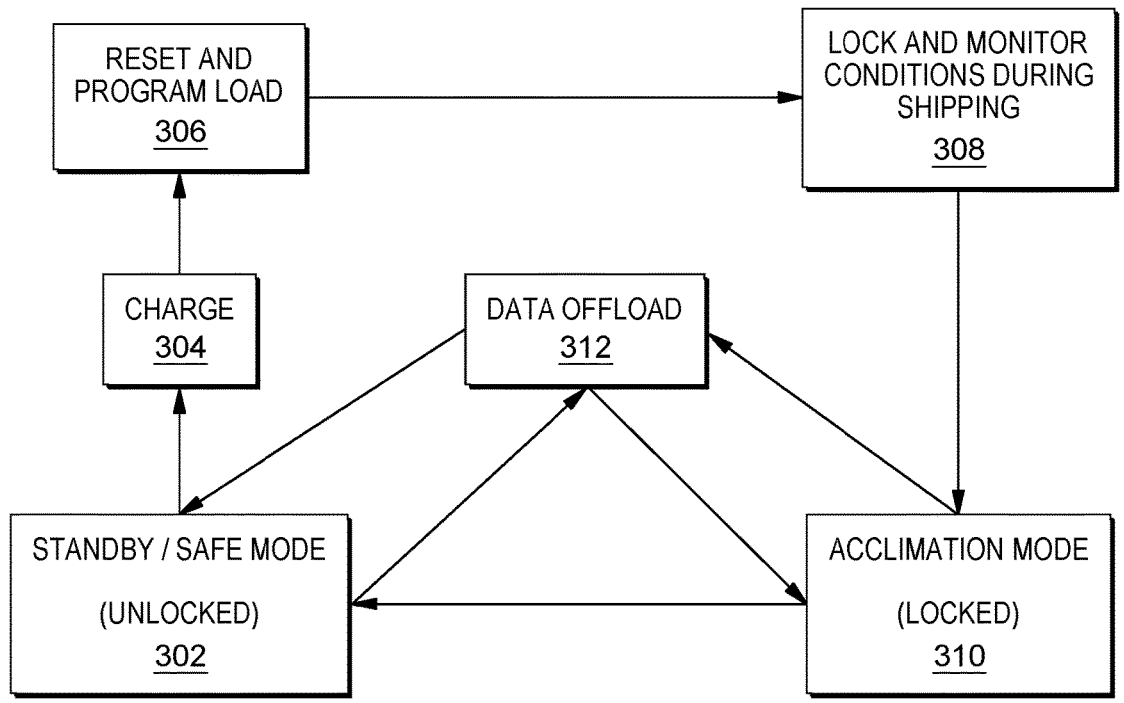
FIG. 3 depicts a state diagram for the interlocking device, in accordance with one embodiment of the present invention.

FIG. 3 depicts a state diagram for the interlocking device, in accordance with one embodiment of the present invention. In this embodiment, one or more states of the interlocking device are controlled by acclimation program 208. As the interlocking device is prepared for installation on a housing of an input power connector on electronic equipment being shipped, the interlocking device is in a standby/safe mode (302) in an unlocked position representing a disengaged state. The interlocking device can be charged (304) prior to installation to ensure a battery of interlocking device has sufficient charge to collect shipping and acclimation data for the duration of the shipment and installation process. The interlocking device is reset, and a program loaded (306) that includes specific conditions and threshold for the shipping and acclimation process. The interlocking device locks and monitors (308) conditions during shipping, where a locked position of the interlocking device represents an engaged state. Subsequent to the electronic equipment arriving at an installation site, the interlocking device enters an acclimation mode (310), where the interlocking device remains locked and in the engaged state until acclimation conditions are met. The interlocking device performs a data offload (312) of the collected shipping and acclimation data and reverts back to the standby/safe mode (302), where the interlocking device is in the disengaged state and removable from the housing of the input power connector on the electronic equipment.

Figure 4:
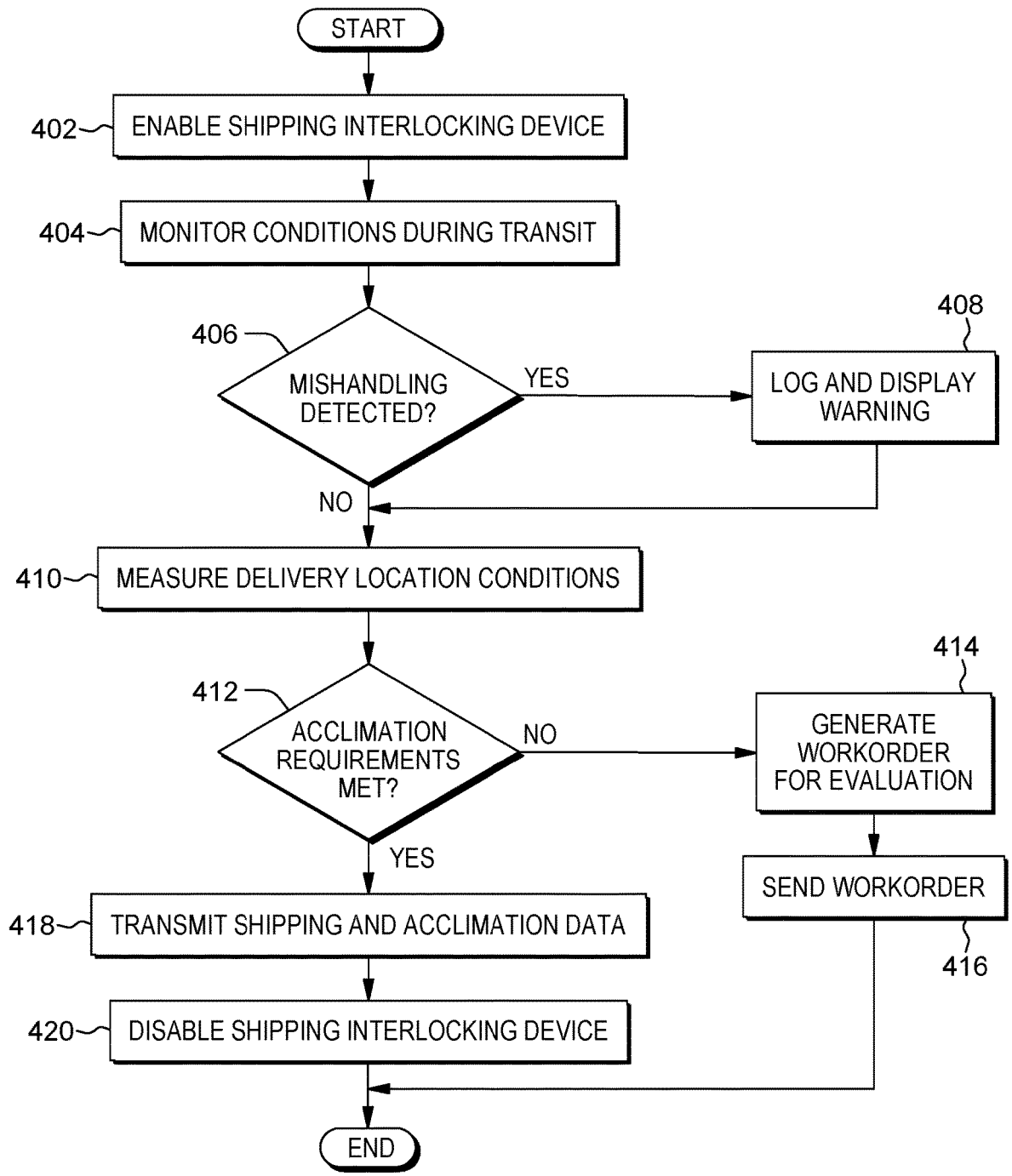
FIG. 4 is a flowchart depicting operational steps of an acclimation program for monitoring transit and acclimation conditions, in accordance with one embodiment of the present invention.

FIG. 4 is a flowchart depicting operational steps of an acclimation program for monitoring transit and acclimation conditions, in accordance with one embodiment of the present invention.

Acclimation program 208 enables (402) shipping interlocking device. In this embodiment, electronic equipment is being prepared for shipment to an installation location, where the electronic equipment requires that shipping and acclimations conditions are met prior to powering on. The shipping interlocking device is installed on a housing of an input power connector for the electronic equipment, where the shipping interlocking device includes one or more sensors for monitoring conditions during the shipping and acclimation process. The shipping interlocking device also prevents the housing of the input power connector from being electrically coupled (i.e., plugged in) to a power source. In this embodiment, acclimation program 208 enables shipping interlocking device by engaging one or more locking pins on the shipping interlocking device, where engaging the one or more locking pins places the shipping interlocking device into an engaged state. The shipping interlocking device is no longer removable from the housing of the input power connector while in the engaged state. Acclimation program 208 further enables the shipping interlocking device by configuring the shipping interlocking device according to the electronic equipment being shipped.

Configuring the shipping interlocking device can include identifying which of the one or more sensors of the shipping interlocking device are to collect data during the shipping and acclimation process. Configuring the shipping interlocking device can further include receiving user (e.g., manufacturer) defined intervals for collecting the data from the one or more sensors, where the shipping interlocking device collects and transmits the data from one or more sensors at set time interval and/or designated touch point locations along the shipping route. Acclimation program 208 utilizes shipping condition limitations and acclimation condition requirements to monitor the shipping and acclimation process of the electronic equipment with the shipping interlocking device.

Acclimation program 208 monitors (404) conditions during transit. In this embodiment, acclimation program 208 monitors conditions during transit for the electronic equipment by receiving shipping data from the shipping interlocking device. Shipping interlocking device includes a location module and a communication module for transmitting shipping data at set time intervals (e.g., 60 seconds) and/or designated touch point locations along the shipping route. As acclimation program 208 receives shipping data from the shipping interlocking device, acclimation program 208 can compare the shipping data to the user defined shipping condition limitations. In another embodiment, acclimation program 208 receives shipping data from the shipping interlocking device when the shipping interlocking device determines that shipping data includes one or more readings (e.g., humidity level) from one or more sensors that does not meet the user defined shipping condition limitations (e.g., humidity level exceeds 70%). In yet another embodiment, the shipping interlocking device continuously collects shipping data from the one or more sensors and stores the collected shipping data in embedded memory on the shipping interlocking device, where the collected shipping data is retrievable from the embedded memory utilizing a hard-wire connection through a USB-C port and/or ethernet port on the shipping interlocking device.

Acclimation program 208 determines whether a mishandling event has occurred based on the shipping conditions (decision 406). In the event acclimation program 208 determining a mishandling event has occurred ("yes" branch, 406), acclimation program 208 logs and displays (408) a warning with regards to the mishandling event. In the event acclimation program 208 determines a mishandling event has not occurred ("no" branch, 406), acclimation program 208 measures (410) deliver location conditions. A mishandling event represents an instance of one or more readings from one or more sensors on the shipping interlocking device breaching one or more of the user defined shipping condition limitations.

Acclimation program 208 logs and displays (408) a warning with regards to the mishandling event. In this embodiment, where shipping interlocking device has a communication module, acclimation program 208 logs and displays the warning with regards to the mishandling event as a notification in a user interface on a client device associated with user shipping the electronic equipment. In another embodiment, where shipping interlocking device does not have a communication module, acclimation program 208 logs and displays the warning regards to the mishandling event utilizing one or more designated LEDs on the shipping interlocking device, where the one or more designated LEDs are viewable by a user (e.g., shipment handler, technician). The one or more designated LEDs on the shipping interlocking device indicate whether the electronic equipment experienced a mishandling event during the shipping process. Shipping data can subsequently be downloaded directly from the shipping interlocking device for further evaluation. In yet another embodiment, where shipping interlocking device has a communication module, acclimation program 208 logs and displays the warning regards to the mishandling event utilizing both, the one or more designated LEDs and as a notification in a user interface on a client device.

Acclimation program 208 measures (410) delivery location conditions. Subsequent to the shipment of the electronic equipment arriving at the delivery location, acclimation program 208 measures delivery location conditions via the shipping interlocking device, where the delivery conditions include but are not limited to a temperature value, a humidity value, and a dew point value.

Acclimation program 208 determines whether acclimation requirements for the electronic equipment are met (decision 412). In the event acclimation program 208 determines the acclimation requirements for the electronic equipment are not met ("no" branch, 412), acclimation program 208 generates (414) a workorder for evaluation. In the event acclimation program 208 determines the acclimation requirement for the electronic equipment are met ("yes" branch, 412), acclimation program 208 transmits (418) shipping and acclimation data. Acclimation program 208 utilizes the previously received acclimation condition requirements to determine whether the measured delivery location conditions meet the acclimation requirements for the electronic equipment.

Acclimation program 208 generates (414) a workorder for evaluation and acclimation program 208 sends (416) the workorder to a technician for evaluation. The workorder that acclimation program 208 generates specifies which of the one or more acclimation requirements are not met and includes the measured delivery location conditions (i.e., temperature value, humidity value, and dew point value).

Acclimation program 208 transmits (418) shipping and acclimation data. In this embodiment, where the shipping interlocking device has a communication module, acclimation program 208 previously received the shipping data in set time interval and/or designated touch point locations along the shipping route and the acclimation data with the measured delivery location conditions. Acclimation program 208 transmits the shipping and acclimation data to a database for storage. Any shipping and acclimation data previously not received by acclimation program 208 is sent by the shipping interlocking device and acclimation program 208 transmits the shipping and acclimation data to the database for storage. In another embodiment, where shipping interlocking device does not have a communication module, a client device is physically connected to the shipping interlocking device and acclimation program 208 transmits the shipping and acclimation data from the shipping interlocking device to the database for storage.

Acclimation program 208 disables (420) shipping interlocking device. In this embodiment, acclimation program 208 disables shipping interlocking device by disengaging the one or more locking pins on the shipping interlocking device, where disengaging the one or more locking pins places the shipping interlocking device into a disengaged state. The shipping interlocking device is removable from the housing of the input power connector while in the engaged state. Disabling the shipping interlocking device can further include acclimation program 208 clearing an embedded memory on the shipping interlocking device, to allow for the shipping interlocking device to be returned to the manufacturer and installed on another electronic equipment being prepared for shipment.

Figure 5:
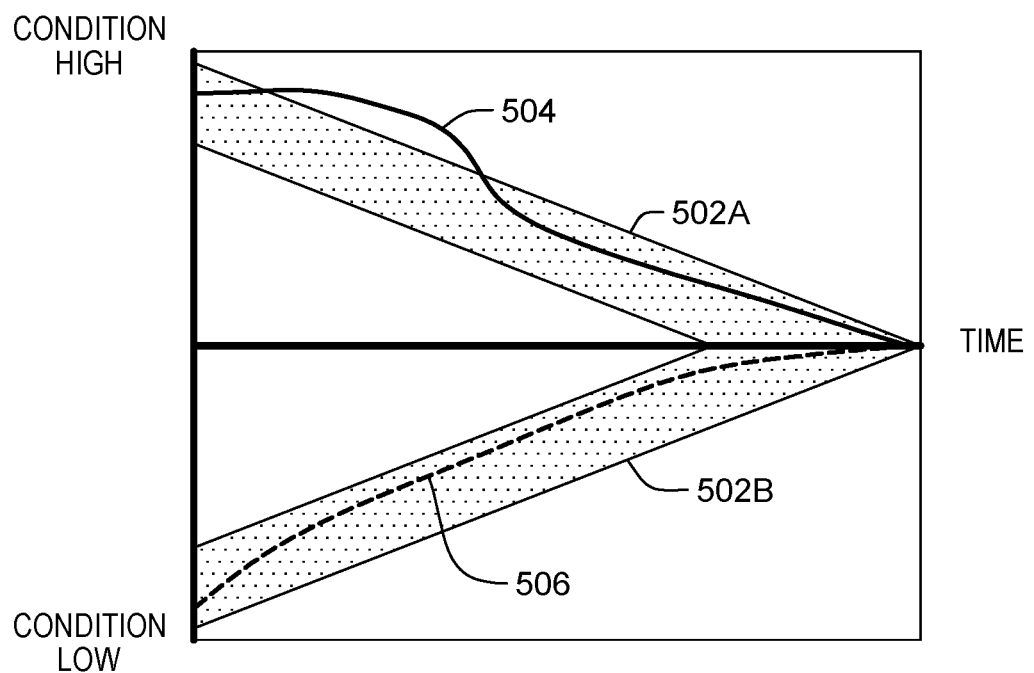
FIG. 5 illustrates an acclimation enforcement profile, in accordance with one embodiment of the present invention.

FIG. 5 illustrates an acclimation enforcement profile, in accordance with one embodiment of the present invention. As previously discussed, subsequent to the shipment arriving at a destination location, the electronic equipment undergoes acclimation relative to conditions present at the destination location. Acclimation is path and time dependent, where acclimation conditions (e.g., temperature, humidity levels) are monitored to ensure that acclimation requirements are adhered to. A slow or rapid condition change can indicate an acclimation issue, thus preventing interlocking device from decoupling from a housing of a power input connector for the electronic equipment. Acclimation window 502A represents an acceptable acclimation range for a condition (e.g., humidity level) that is deemed high and acclimation window 502B represents an acceptable acclimation range for a condition that is deemed low (e.g., temperature). Unacceptable path 504 represents a condition change that fell outside acclimation window 502A and acceptable path 506 represents a condition change that remained within acclimation window 502B. As result of the acclimation process not being adhered to due to unacceptable path 504 falling outside acclimation window 502A, interlocking device remains engaged to the housing of the power input connector for the electronic equipment.

Figure 6A:
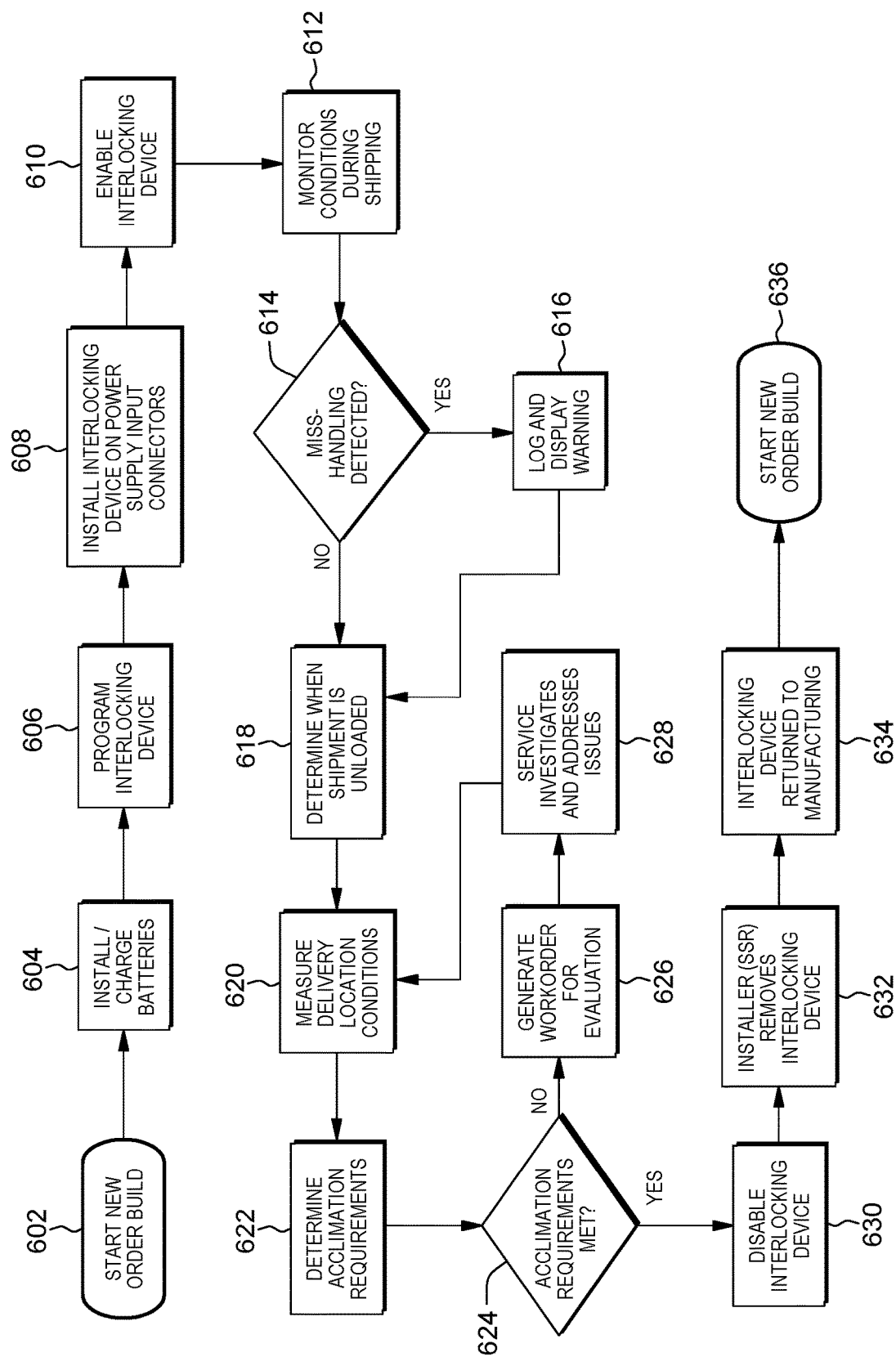
FIG. 6A is a process flow for an interlocking device utilizing a wireless connection, in accordance with one embodiment of the present invention.

FIG. 6A is a process flow for an interlocking device utilizing a wireless connection, in accordance with one embodiment of the present invention. In this process flow, the interlocking device includes an embedded communication module for utilization with a wireless connection to generate and send workorders associated with acclimation requirements not being met. The process includes starting (602) a new order build for electronic equipment with a dedicated input power connector. The process includes installing and/or charging (604) of one or more batteries of the interlocking device and programming (606) the interlocking device according to the shipping and acclimation requirements for the electronic equipment associated with the new order build. The process includes installing (608) the interlocking device on the power supply input connectors and enabling (610) the interlocking device, where the interlocking device is in an engaged state. The process includes monitoring (612) conditions during the shipping of the electronic equipment with installed interlocking device and determining whether a mishandling event has been detected by the interlocking device. Responsive to determining a mishandling event has been detected by the interlocking device, the process includes logging and displaying a warning associated with the mishandling event (616).

The process further includes determining (618) when the shipment is unloaded at a delivery location and measuring (620) delivery location conditions for acclimation. The process includes determining (622) acclimation requirements for the electronic equipment and determining whether the acclimation requirements for the electronic equipment are met. Responsive to the acclimation requirements for the electronic equipment not being met, the process include generating (626) a workorder for evaluation by a service technician and the service technician investigating and addressing (628) issues associated with the acclimation requirements that are not met. Responsive to the acclimation requirements for the electronic equipment being met, the process includes disabling (630) interlocking device, where the interlocking device is in a disengaged state and an installer removing (632) the interlocking device from the power supply input connectors on the electronic equipment. The process concludes with the interlocking device being returned to the manufacturing site (634) and starting a new order build (636), where the interlocking device is to be reused and reprogramed according to the new build.

Figure 6B:
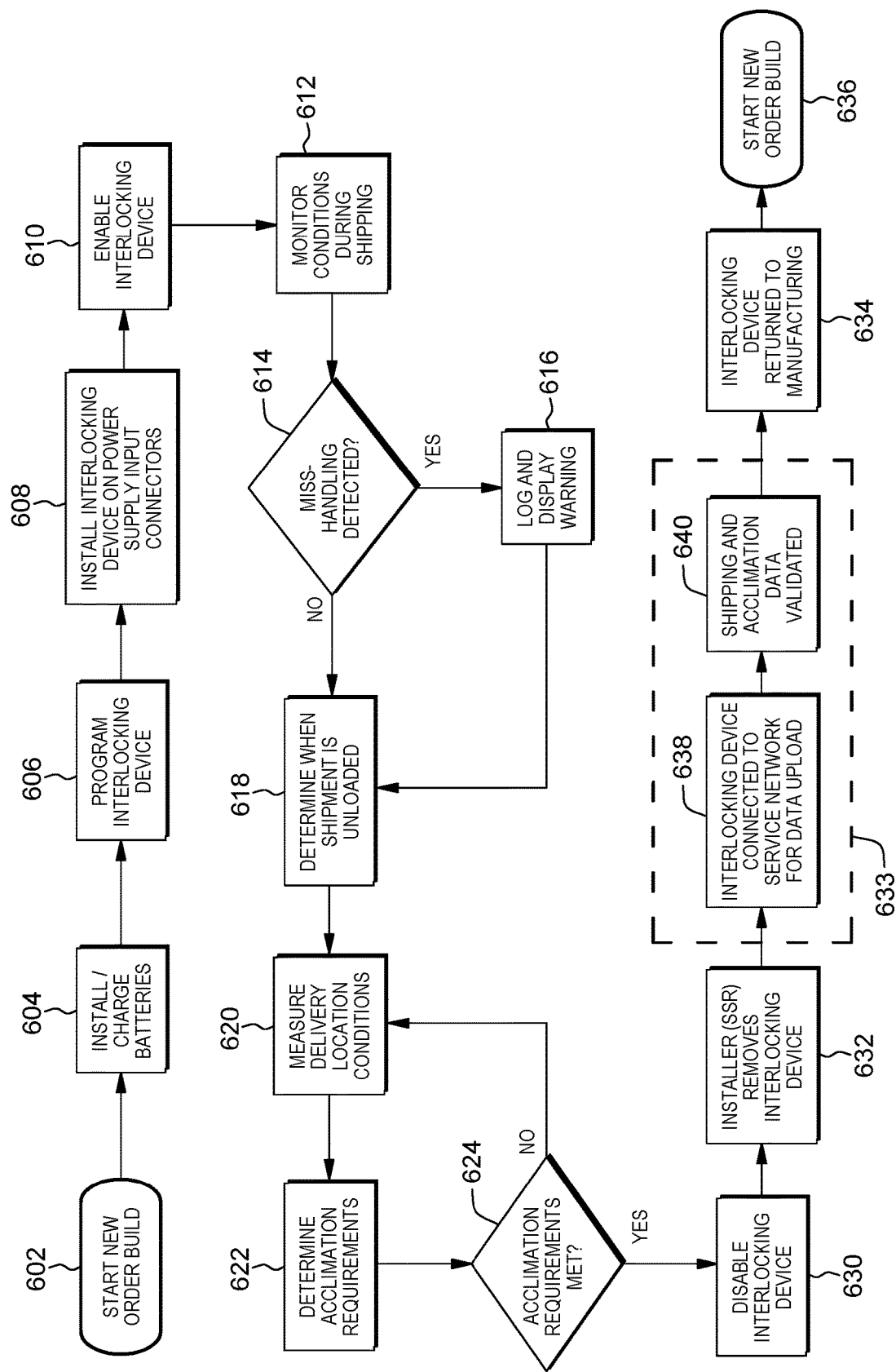
FIG. 6B is a process flow for an interlocking device utilizing a service network, in accordance with one embodiment of the present invention.

FIG. 6B is a process flow for an interlocking device utilizing a service network, in accordance with one embodiment of the present invention. The process flow for an interlocking device utilizing a service network does not include generating a workorder for evaluation by a service technician and the service technician investigating and addressing issues associated with the acclimation requirements that are not met, when compared to utilizing a wireless connection. Process includes service network validation (633), where the interlocking device is connected (638) to a service network for data upload utilizing a hardwire connection (e.g., via a USB-C port or ethernet port) and validating (640) the shipping and acclimation data from the interlocking device for the electronic equipment.

Figure 7:
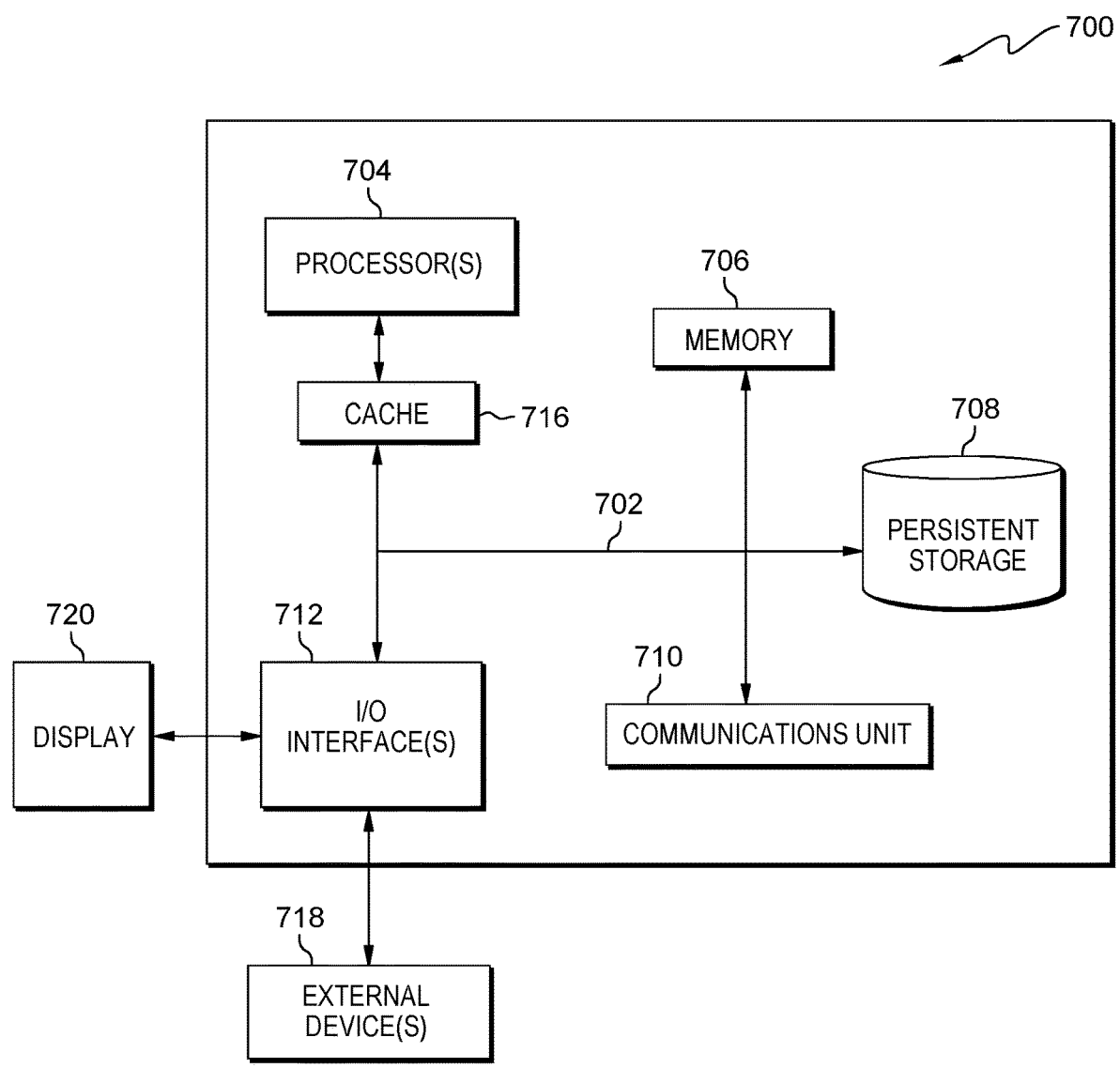
FIG. 7 depicts a block diagram of components of a computer system for performing the operational steps of the acclimation program, in an embodiment, in accordance with the present invention.

FIG. 7 depicts a block diagram of components of a computer system for performing the operational steps of acclimation program 208, in an embodiment, in accordance with the present invention. Computer system 700 represents a centralized hub (e.g., server computer) on which acclimation program 208 operates. The computer system includes processors 704, cache 716, memory 706, persistent storage 708, communications unit 710, input/output (I/O) interface(s) 712 and communications fabric 702. Communications fabric 702 provides communications between cache 716, memory 706, persistent storage 708, communications unit 710, and input/output (I/O) interface(s) 712. Communications fabric 702 can be implemented with any architecture designed for passing data and/or control information between processors (such as microprocessors, communications and network processors, etc.), system memory, peripheral devices, and any other hardware components within a system. For example, communications fabric 702 can be implemented with one or more buses or a crossbar switch.

Memory 706 and persistent storage 708 are computer readable storage media. In this embodiment, memory 706 includes random access memory (RAM). In general, memory 706 can include any suitable volatile or non-volatile computer readable storage media. Cache 716 is a fast memory that enhances the performance of processors 704 by holding recently accessed data, and data near recently accessed data, from memory 706.

Program instructions and data used to practice embodiments of the present invention may be stored in persistent storage 708 and in memory 706 for execution by one or more of the respective processors 704 via cache 716. In an embodiment, persistent storage 708 includes a magnetic hard disk drive. Alternatively, or in addition to a magnetic hard disk drive, persistent storage 708 can include a solid state hard drive, a semiconductor storage device, read-only memory (ROM), erasable programmable read-only memory (EPROM), flash memory, or any other computer readable storage media that is capable of storing program instructions or digital information.

The media used by persistent storage 708 may also be removable. For example, a removable hard drive may be used for persistent storage 708. Other examples include optical and magnetic disks, thumb drives, and smart cards that are inserted into a drive for transfer onto another computer readable storage medium that is also part of persistent storage 708.

Communications unit 710, in these examples, provides for communications with other data processing systems or devices. In these examples, communications unit 710 includes one or more network interface cards. Communications unit 710 may provide communications through the use of either or both physical and wireless communications links. Program instructions and data used to practice embodiments of the present invention may be downloaded to persistent storage 708 through communications unit 710.

I/O interface(s) 712 allows for input and output of data with other devices that may be connected to each computer system. For example, I/O interface 712 may provide a connection to external devices 718 such as a keyboard, keypad, a touch screen, and/or some other suitable input device. External devices 718 can also include portable computer readable storage media such as, for example, thumb drives, portable optical or magnetic disks, and memory cards. Software and data used to practice embodiments of the present invention can be stored on such portable computer readable storage media and can be loaded onto persistent storage 708 via I/O interface(s) 712. I/O interface(s) 712 also connect to display 720.

Display 720 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product at any possible technical detail level of integration. The computer program product may include a computer readable storage medium (or media) having computer readable program instructions thereon for causing a processor to carry out aspects of the present invention. The computer readable storage medium can be a tangible device that can retain and store instructions for use by an instruction execution device.

The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. An interlocking device for monitoring and enforcing shipping and acclimation conditions, the interlocking device comprising:
   a servo motor, at least one locking pin, a battery, and a printed circuit board disposed within an enclosure, wherein the battery is electrically coupled to the servo motor and the printed circuit board;
   a housing of an input power connector insertable into or onto a first end of the enclosure to prevent the housing of the input power connector from electrically coupling to a power source, wherein the servo motor is configurable to engage the at least one locking pin to prevent a removal of the enclosure from the housing of the input power connector; and
   the printed circuit board configured to control the servo motor based on readings from one or more sensors electrically coupled to the printed circuit board.

2. The interlocking device of claim 1, wherein the at least one locking pin is disposed in an aperture of an outer shell of the housing of the input power connector.

3. The interlocking device of claim 2, further comprising:
   the at least one locking pin is disposed in an aperture of the enclosure, wherein a portion of the at least one locking pin protrudes beyond an exterior planar surface of the enclosure.

4. The interlocking device of claim 3, further comprising:
   the at least one locking pin is disposed in at least one electrical prong in the housing of the input power connector.

5. The interlocking device of claim 4, wherein the at least one electrical prong protrudes from a recessed base surrounded by the outer shell of the housing of the input power connector.

6. The interlocking device of claim 1, further comprising:
   a first end of the at least one locking pin pressed against an inner surface of an outer shell of the housing of the input power connector, wherein a pressure created between the first end of the at least one locking pin prevents the removal of the enclosure from the housing of the input power connector.

7. The interlocking device of claim 6, wherein the input power connector is for a device selected from a group consisting of a power distribution unit and a bulk power assembly.

8. The interlocking device of claim 7, further comprising:
at least one electrical prong protruding from a recessed base surrounded by the outer shell of the housing of the input power connector.

9. The interlocking device of claim 1, where the one or more sensors are selected from a group consisting of: a temperature sensor, a humidity sensor, a gyroscope sensor, and an accelerometer.

10. The interlocking device of claim 1, further comprising:
at least one data transfer port electrically coupled to the printed circuit board, where the at least one data transfer port is accessible from an exterior surface of the enclosure.

11. The interlocking device of claim 10, wherein the at least one data transfer port is positioned at a second end of the enclosure opposite the first end of the enclosure.

12. The interlocking device of claim 11, wherein the at least one data transfer port is selected from a group consisting of: a USB-C port or an Ethernet port.

13. The interlocking device of claim 11, wherein the at least one data transfer port is a charging downstream port configurable to charge the battery.

14. The interlocking device of claim 1, wherein a clockwise rotational movement by the servo motor engages the at least one locking pin and a counterclockwise rotational movement by the servo motor disengages the at least one locking pin.

15. The interlocking device of claim 1, wherein a counterclockwise rotational movement by the servo motor engages the at least one locking pin and a clockwise rotational movement by the servo motor disengages the at least one locking pin.

16. The interlocking device of claim 1, wherein the servo motor is coupled to one or more rack and pinion combinations to actuate an engaging and disengaging motions of the at least one locking pins.

* * * * *